United States Patent
Shi et al.

(10) Patent No.: US 11,802,817 B1
(45) Date of Patent: Oct. 31, 2023

(54) RESERVOIR BANK LANDSLIDE SUSCEPTIBILITY EVALUATION METHOD

(71) Applicant: Chengdu University of Technology, Chengdu (CN)

(72) Inventors: Xianlin Shi, Chengdu (CN); Keren Dai, Chengdu (CN); Chen Chen, Chengdu (CN)

(73) Assignee: Chengdu University of Technology, Sichuan Province (CN)

( * ) Notice: Subject to any disclaimer, the term of this patent is extended or adjusted under 35 U.S.C. 154(b) by 0 days.

(21) Appl. No.: 18/131,684

(22) Filed: Apr. 6, 2023

(30) Foreign Application Priority Data

Aug. 29, 2022 (CN) .......................... 202211036619.9

(51) Int. Cl.
| | |
|---|---|
| G06F 11/30 | (2006.01) |
| G01M 99/00 | (2011.01) |
| G06F 30/20 | (2020.01) |
| G06T 7/30 | (2017.01) |
| G06T 7/00 | (2017.01) |

(52) U.S. Cl.
CPC .......... G01M 99/005 (2013.01); G06F 30/20 (2020.01); G06T 7/0002 (2013.01); G06T 7/30 (2017.01); *G06T 2207/30181* (2013.01)

(58) Field of Classification Search
CPC .................................................. G01M 99/005
See application file for complete search history.

(56) References Cited

U.S. PATENT DOCUMENTS

2019/0368150 A1\* 12/2019 Kasahara ................ E02D 17/20

FOREIGN PATENT DOCUMENTS

| CN | 102707332 A | \* | 10/2012 | |
|---|---|---|---|---|
| WO | WO-2021217763 A1 | \* | 11/2021 | ............. G01B 21/02 |

\* cited by examiner

*Primary Examiner* — Phuong Huynh
(74) *Attorney, Agent, or Firm* — Lee & Hayes, P.C.

(57) ABSTRACT

A reservoir bank landslide susceptibility evaluation method. The method includes the following steps: S1, acquiring geophysical parameters; S2, calculating stability of a reservoir bank after impoundment through a static geological evaluation model according to the geophysical parameters; S3, obtaining an average displacement velocity in a geographic coordinate system according to single look complex (SLC) images after impoundment; and S4, according to the average displacement velocity in the geographic coordinate system and the stability of the reservoir bank after impoundment of the reservoir, obtaining a reservoir bank landslide susceptibility grade. According to the method, a problem that present landslide susceptibility evaluation methods all adopt a single model to evaluate landslide susceptibility, which has low evaluation accuracy of the landslide susceptibility is solved.

6 Claims, 1 Drawing Sheet

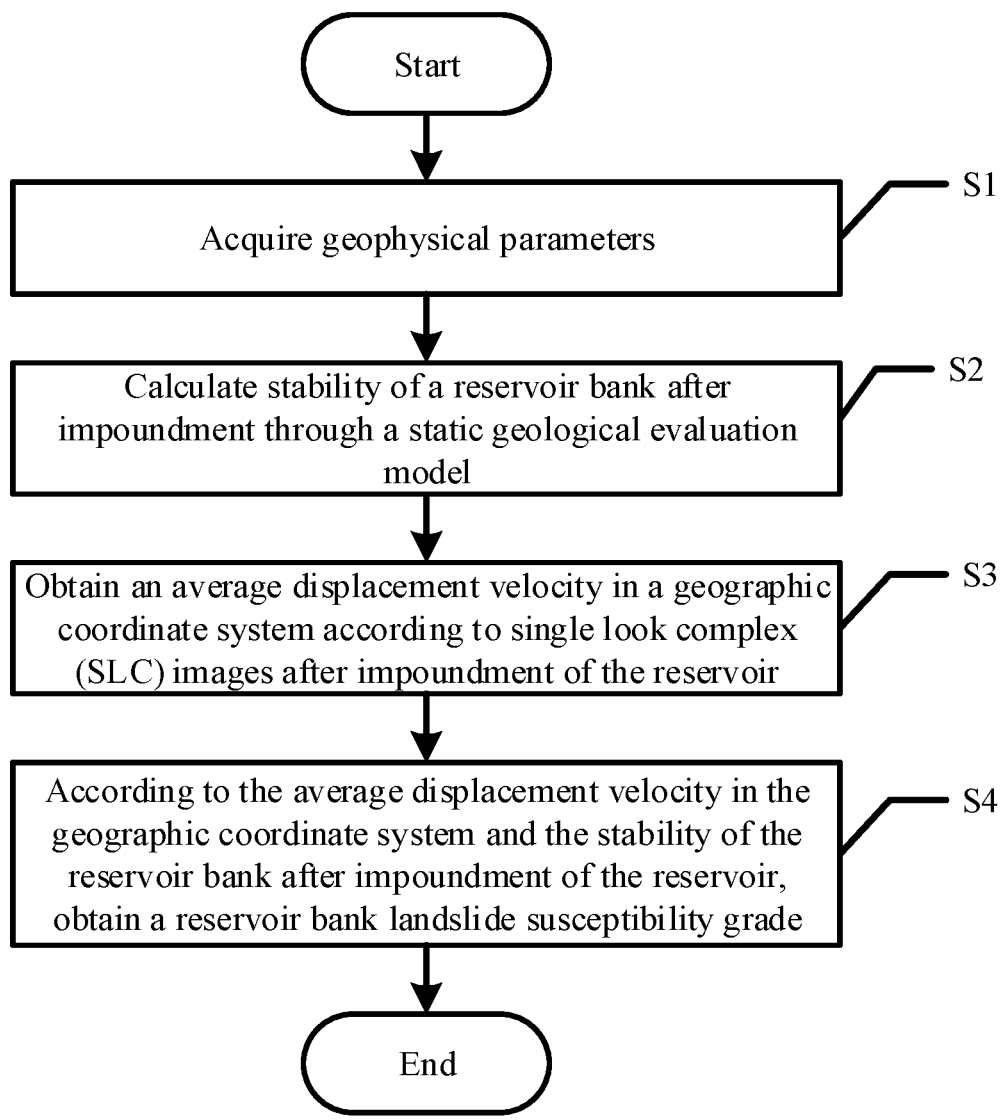

RESERVOIR BANK LANDSLIDE SUSCEPTIBILITY EVALUATION METHOD

CROSS REFERENCE TO RELATED APPLICATION

This patent application claims the benefit and priority of Chinese Patent Application No. 202211036619.9, filed with the China National Intellectual Property Administration on Aug. 29, 2022, the disclosure of which is incorporated by reference herein in its entirety as part of the present application.

TECHNICAL FIELD

The present disclosure relates to the technical field of landslide evaluation, in particular to a reservoir bank landslide susceptibility evaluation method.

BACKGROUND

The variation of reservoir water level can easily lead to related disasters of rock and soil mass on slope. In particular, landslides have become a widespread geological problem to reservoirs and is the biggest threat and obstacle to the economic and social development of reservoir areas. Impoundment and drainage can induce large-scale reservoir bank landslide. For susceptibility evaluation, the potential location of landslide can be controlled by multi-type evaluation model combined with various evaluation factors. Therefore, it is of great significance for the safe operation of hydropower station to identify the potential location of landslide on the reservoir bank in time.

At present, many evaluation methods about landslide susceptibility have been proposed, but they all adopt a single model to evaluate the landslide susceptibility, which has the problem of low evaluation accuracy of landslide susceptibility.

SUMMARY

In view of the above deficiencies in the previous method, a reservoir bank landslide susceptibility evaluation method proposed by the present disclosure solves a problem that existing landslide susceptibility evaluation methods all adopt a single model to evaluate landslide susceptibility, which has the problem of low evaluation accuracy of the landslide susceptibility.

To achieve the above objective of the present disclosure, the present disclosure adopts the following technical solutions: a reservoir bank landslide susceptibility evaluation method includes the following steps:

S1, acquiring geophysical parameters;
S2, calculating the reservoir bank stability after impoundment through a static geological evaluation model according to the geophysical parameters;
S3, obtaining an average displacement velocity in a geographic coordinate system according to single look complex (SLC) images after impoundment;
S4, according to the average displacement velocity in the geographic coordinate system and the stability of the reservoir bank after impoundment, obtaining a reservoir bank landslide susceptibility grade.

Further, the geophysical parameters in step S1 include: cohesion, the angle of internal friction, the unit weight and the pore water pressure of rock and soil mass near the reservoir bank after impoundment.

Further, step S2 includes the following sub-steps:
S21, establishing a search matrix above reservoir terrain;
S22, generating multiple spherical retrieval points in the search matrix;
S23, generating a spherical center of the spherical retrieval points according to the spherical retrieval points;
S24, gridding a potential landslide body into multiple three-dimensional (3D) columns;
S25, constructing the static geological evaluation model according to the spherical center of the spherical retrieval points, the 3D columns, and the geophysical parameters; and
S26, calculating the stability of the reservoir bank after impoundment according to the static geological evaluation model.

Further, a formula of the static geological evaluation model in step S25 is:

$$Fs = \frac{\sum R[cA + (W - uA)\tan \phi]}{\sum W(R \sin \alpha + ke) * (\cos \beta + (\sin \alpha \tan \varphi)/T)}$$

where Fs is the stability of the reservoir bank after impoundment, R is a distance between the spherical center and a potential landslide surface, A is a surface area of the potential landslide surface on the reservoir bank, $\alpha$ is an apparent dip angle of the potential landslide surface on the reservoir bank, $\beta$ is a dip angle of the potential landslide surface on the reservoir bank, e is a distance between the spherical center and a center of mass of each of the 3D columns, W is the unit weight of the rock and soil mass, u is the pore water pressure of the rock and soil mass, k is a horizontal vibration load, c is the cohesion of the rock and soil mass, $\varphi$ is the internal friction angle of the rock and soil mass, and T is a proportionality constant.

Further, step S3 includes the following sub-steps:
S31, according to the SLC images after impoundment of the reservoir, generating M interference pairs, and calculating a line of sight (LOS) displacement phase;
S32, according to the LOS displacement phase, performing two phase unwrapping and filtering to obtain the error removal interference pair;
S33, according to the error removal interference pair, inversing an average displacement velocity of the interference pairs; and
S34, geocoding the average displacement velocity of the interference pairs to obtain the average displacement velocity in the geographic coordinate system.

Further, step S31 includes the following sub-steps:
S311, acquiring multiple SLC images after impoundment of the reservoir;
S312, selecting one SLC image as the master image, and registering the master image with the remaining SLC images to generate the M interference pairs;
S313, performing difference processing on each interference pair to obtain M multi-view difference interferograms; and
S314, calculating the LOS displacement phase according to the interference phase of the M multi-view difference interferograms.

Further, a range of the M interference pairs in step S312 is:

$$N/2 \leq M \leq (N-1)N/2$$

where N is the number of SLC images.

The further solution of the present disclosure has the following beneficial effects:

The multiple SLC images after impoundment of the reservoir are subjected to interference processing to obtain the interferograms after impoundment of the reservoir in order to view the obvious displacement points.

Further, a formula for calculating the LOS displacement phase in step S314 is:

$$\varphi_{disp}=\varphi-\varphi_{topo}-\varphi_{atm}-\varphi_{res}$$

where $\varphi_{disp}$ is the LOS displacement phase, $\varphi$ is the interference phase of the interferograms, $\varphi_{topo}$ is the topographic phase, $\varphi_{atm}$ is the atmospheric phase, and Pres is the noise phase.

Further, step S32 includes the following sub-steps:

S321, performing phase unwrapping on the LOS displacement phase by a minimum cost flow method to obtain the interference unwrapping phase set;

S322, correcting orbital parameters of the interference unwrapping phase set, and removing residual phases and a phase jump from the interference unwrapping phase set to obtain an unwrapping corrected interference pair;

S323, unwrapping wrapped phases in the unwrapping corrected interference pair again to obtain the secondary unwrapping interference pair; and S324, performing high-pass filtering in space and low-pass filtering in time on the secondary unwrapping interference pair to obtain the error removal interference pair.

The further solution of the present disclosure has the following beneficial effects:

Error phases such as the topographic phase and the atmospheric phase are removed from the interference phase obtained after interference processing by the minimum cost flow method and filtering.

In conclusion, the present disclosure has the following beneficial effects: on the one hand, the stability of the reservoir bank after impoundment of the reservoir is calculated through the geophysical parameters and the static geological evaluation model. On the other hand, M interference pairs are generated through the SLC images, and through two times of phase unwrapping and filtering, the residual phase slope or topographic phase can be removed from the interference pairs, so as to accurately obtain the average displacement velocity in the geographic coordinate system. Compared with the present single model, the method integrates the average displacement velocity in the geographic coordinate system and the stability of the reservoir bank after impoundment of the reservoir to obtain the reservoir bank landslide susceptibility grade, which more accurately reflects the reservoir bank landslide susceptibility.

BRIEF DESCRIPTION OF THE DRAWINGS

FIG. 1 is a flow chart of a reservoir bank landslide susceptibility evaluation method.

DETAILED DESCRIPTION OF THE EMBODIMENTS

The specific implementations of the present disclosure are described below to facilitate those skilled in the art to understand the present disclosure, but it should be clear that the present disclosure is not limited to the scope of the specific implementations. Various obvious changes made by those of ordinary skill in the art within the spirit and scope of the present disclosure defined by the appended claims should fall within the protection scope of the present disclosure.

As shown in FIG. 1, a reservoir bank landslide susceptibility evaluation method includes the following steps.

S1, Geophysical parameters are acquired.

The geophysical parameters in step S1 include: cohesion, the angle of internal friction, the unit weight and the pore water pressure of rock and soil mass near the reservoir bank after impoundment of the reservoir.

S2, Stability of a reservoir bank after impoundment is calculated through a static geological evaluation model according to the geophysical parameters.

Step S2 includes the following sub-steps.

S21, A search matrix is established above reservoir terrain.

S22, Multiple spherical retrieval points are generated in the search matrix.

S23, A spherical center of the spherical retrieval points is generated according to the spherical retrieval points.

S24, A potential landslide body is gridded into multiple 3D columns.

S25, The static geological evaluation model is constructed according to the spherical center of the spherical retrieval points, the 3D columns, and the geophysical parameters.

A formula of the static geological evaluation model in step S25 is:

$$Fs = \frac{\sum R[cA + (W - uA)\tan \phi]}{\sum W(R \sin \alpha + ke) * (\cos \beta + (\sin \alpha \tan \varphi)/T)}$$

where Fs is the stability of the reservoir bank after impoundment, R is a distance between the spherical center and a potential landslide surface, A is a surface area of the potential landslide surface on the reservoir bank, $\alpha$ is an apparent dip angle of the potential landslide surface on the reservoir bank, $\beta$ is a dip angle of the potential landslide surface on the reservoir bank, e is a distance between the spherical center and a center of mass of each of the 3D columns, W is the unit weight of the rock and soil mass, u is the pore water pressure of the rock and soil mass, k is a horizontal vibration load, c is the cohesion of the rock and soil mass, $\varphi$ is the internal friction angle of the rock and soil mass, and T is a proportionality constant.

S26, The stability of the reservoir bank after impoundment of the reservoir is calculated according to the static geological evaluation model.

S3, An average displacement velocity in a geographic coordinate system is obtained according to SLC images after impoundment of the reservoir.

Step S3 includes the following sub-steps.

S31, According to the SLC images after impoundment of the reservoir, M interference pairs are generated, and an LOS displacement phase is calculated.

SLC is the abbreviation of single look complex, LOS is the abbreviation of line of sight.

Step S31 includes the following sub-steps.

S311, Multiple SLC images after impoundment of the reservoir are acquired.

S312, One SLC image is selected as the master image, and the master image is registered with the remaining SLC images to generate the M interference pairs.

A range of the M interference pairs in step S312 is:

$$N/2 \leq M \leq (N-1)N/2$$

where N is the number of the SLC images.

S313, Difference processing is performed on each interference pair to obtain M multi-view difference interferograms.

S314, The LOS displacement phase is calculated according to the interference phase of the M multi-view difference interferograms.

A formula for calculating the LOS displacement phase in step S314 is:

$$\varphi_{disp} = \varphi - \varphi_{topo} - \varphi_{atm} - \varphi_{res}$$

where $\varphi_{disp}$ is the LOS displacement phase, $\varphi$ is the interference phase of the interferograms, $\varphi_{topo}$ is the topographic phase, $\varphi_{atm}$ is the atmospheric phase, and $\varphi_{res}$ is the noise phase.

S32, According to the LOS displacement phase, phase unwrapping and filtering are performed twice to obtain an error removal interference pair.

Step S32 includes the following sub-steps.

S321, Phase unwrapping is performed on the LOS displacement phase by a minimum cost flow method to obtain the interference unwrapping phase set.

S322, Orbital parameters of the interference unwrapping phase set are corrected, and residual phases and the phase jump are removed from the interference unwrapping phase set to obtain the unwrapping corrected interference pair.

S323, Wrapped phases in the unwrapping corrected interference pair are unwrapped again to obtain a secondary unwrapping interference pair.

S324, High-pass filtering in space and low-pass filtering in time are performed on the secondary unwrapping interference pair to obtain the error removal interference pair, so as to remove the atmospheric phase, the phase slope and the topographic phase.

S33, According to the error removal interference pair, an average displacement velocity of the interference pairs is inversed.

In the present embodiment, the least squares (LS) or singular value decomposition (SVD) method can be used to inverse the average displacement velocity of the interference pair in step S33.

S34, The average displacement velocity of the interference pairs is geocoded to obtain the average displacement velocity in the geographic coordinate system.

S4, According to the average displacement velocity in the geographic coordinate system and the stability of the reservoir bank after impoundment of the reservoir, a reservoir bank landslide susceptibility grade is obtained.

A formula for calculating the reservoir bank landslide susceptibility grade in step S4 is:

$$X = \frac{V_i W_i + S_j W_j}{W_i W_j}$$

$$W_i = 2.5(i-3)^2 + 3$$

$$W_j = 2.5(j-3)^2 + 3$$

where X is the reservoir bank landslide susceptibility, i and j are integers greater than 0, $V_i$ is the i-th grade where the average displacement velocity is located, $W_i$ is the weight of the i-th rank $V_i$ where the average displacement velocity is located, $S_j$ is the j-th grade where the reservoir bank stability is located after impoundment; $W_j$ is the weight of the j-th grade $S_j$ where the reservoir bank stability is located after impoundment.

What is claimed is:

1. A reservoir bank landslide susceptibility evaluation method comprising steps of:
    S1, acquiring geophysical parameters;
    S21, establishing a search matrix above reservoir terrain;
    S22, generating multiple spherical retrieval points in the search matrix;
    S23, generating a spherical center of the spherical retrieval points according to the spherical retrieval points;
    S24, gridding a potential landslide body into multiple three-dimensional (3D) columns;
    S25, constructing a static geological evaluation model according to the spherical center of the spherical retrieval points, the 3D columns, and the geophysical parameters,
    wherein a formula of the static geological evaluation model in step S25 is:

$$Fs = \frac{\sum R[cA + (W - uA)\tan \phi]}{\sum W(R \sin \alpha + ke) * (\cos \beta + (\sin \alpha \tan \varphi)/T)}$$

wherein Fs is a stability of the reservoir bank after impoundment, R is a distance between the spherical center and a potential landslide surface, A is a surface area of the potential landslide surface on the reservoir bank, $\alpha$ is an apparent dip angle of the potential landslide surface on the reservoir bank, $\beta$ is a dip angle of the potential landslide surface on the reservoir bank, e is a distance between the spherical center and a center of mass of each of the 3D columns, W is a unit weight of a rock and soil mass, u is a pore water pressure of the rock and soil mass, k is a horizontal vibration load, c is a cohesion of the rock and soil mass, $\varphi$ is an internal friction angle of the rock and soil mass, and T is a proportionality constant;
    S26, calculating the stability of the reservoir bank after the impoundment according to the static geological evaluation model;
    S31, performing registration on single look complex (SLC) images after the impoundment of a reservoir to generate M interference pairs, and calculating a line of sight (LOS) displacement phase;
    S32, performing phase unwrapping and filtering twice on the LOS displacement phase to obtain an error removal interference pair;
    S33, inversing, by a singular value decomposition (SVD) method, an average displacement velocity of the interference pairs based on the error removal interference pair;
    S34, geocoding the inversed average displacement velocity of the interference pairs to obtain a geocoded average displacement velocity in a geographic coordinate system;
    S4, evaluating a reservoir bank landslide susceptibility grade based on the geocoded average displacement velocity in the geographic coordinate system and the stability of the reservoir bank after the impoundment of the reservoir,
    wherein a formula for calculating the reservoir bank landslide susceptibility grade in step S4 is:

$$X = \frac{V_i W_i + S_j W_j}{W_i W_j}$$

$W_i = 2.5(i-3)^2 + 3$ $W_j = 2.5(j-3)^2 + 3$ where X is the reservoir bank landslide susceptibility, i and j are integers greater than 0, $V_i$ is an i-th grade where the geocoded average displacement velocity is located, $W_i$ is the weight of an i-th rank $V_i$ where the geocoded average displacement velocity is located, $S_j$ is the j-th grade where the reservoir bank stability is located after the impoundment, $W_j$ is the weight of the j-th grade $S_j$ where the reservoir bank stability is located after the impoundment; and S5, based on the reservoir bank landslide susceptibility grade, identifying a potential landslide location of the reservoir bank.

2. The reservoir bank landslide susceptibility evaluation method according to claim 1, wherein the geophysical parameters in step S1 comprise: cohesion, the internal friction angle, the unit weight and the pore water pressure of the rock and soil mass near the reservoir bank after the impoundment of the reservoir.

3. The reservoir bank landslide susceptibility evaluation method according to claim 1, wherein step S31 comprises sub-steps of:

S311, acquiring multiple SLC images after the impoundment of the reservoir;

S312, selecting one SLC image as a master image, and registering the master image with remaining SLC images to generate the M interference pairs;

S313, performing difference processing on each interference pair to obtain M multi-view difference interferograms; and S314, calculating the LOS displacement phase according to an interference phase of the M multi-view difference interferograms.

4. The reservoir bank landslide susceptibility evaluation method according to claim 3, wherein a range of the M interference pairs in step S312 is:

$N/2 \leq M \leq (N-1)N/2$ wherein N is a number of the SLC images.

5. The reservoir bank landslide susceptibility evaluation method according to claim 3, wherein a formula for calculating the LOS displacement phase in step S314 is:

$\varphi_{disp} = \varphi_1 - \varphi_{topo} - \varphi_{atm} - \varphi_{res}$ wherein $\varphi_{disp}$ is the LOS displacement phase, $\varphi_1$ is the interference phase of the interferograms, $\varphi_{topo}$ is a topographic phase, $\varphi_{atm}$ is an atmospheric phase, and $\varphi_{res}$ is a noise phase.

6. The reservoir bank landslide susceptibility evaluation method according to claim 1, wherein step S32 comprises sub-steps of:

S321, performing phase unwrapping on the LOS displacement phase by a minimum cost flow method to obtain an interference unwrapping phase set;

S322, correcting orbital parameters of the interference unwrapping phase set, and removing residual phases and a phase jump from the interference unwrapping phase set to obtain an unwrapping corrected interference pair;

S323, unwrapping wrapped phases in the unwrapping corrected interference pair again to obtain a secondary unwrapping interference pair; and S324, performing high-pass filtering in space and low-pass filtering in time on the secondary unwrapping interference pair to obtain the error removal interference pair.

\* \* \* \* \*